United States Patent
Hsu et al.

[11] Patent Number: 5,930,664
[45] Date of Patent: Jul. 27, 1999

[54] PROCESS FOR PREVENTING CORROSION OF ALUMINUM BONDING PADS AFTER PASSIVATION/ARC LAYER ETCHING

[75] Inventors: Fang-Jen Hsu, Hsin-chu; Chen-Peng Fan; Ming-Shuo Yen, both of Taitung; Chi-Ping Chen, Hsin-chu, all of Taiwan

[73] Assignee: Taiwan Semiconductor Manufacturing Company, Ltd., Hsin-Chu, Taiwan

[21] Appl. No.: 08/899,675

[22] Filed: Jul. 24, 1997

[51] Int. Cl.⁶ .................................................. H01L 21/44
[52] U.S. Cl. ........................ 438/612; 438/695; 438/696; 438/963; 438/976; 438/637; 438/712; 438/724; 438/723; 438/694; 438/680
[58] Field of Search ..................................... 438/612, 695, 438/696, 963, 976, 637, 712, 724, 723, 694, 680

[56] References Cited

U.S. PATENT DOCUMENTS

| | | |
|---|---|---|
| 5,447,598 | 9/1995 | Mihara et al. ............................... 216/46 |
| 5,533,635 | 7/1996 | Man ........................................... 216/67 |
| 5,540,812 | 7/1996 | Kadomura ............................. 156/652.1 |

OTHER PUBLICATIONS

S Wolf et al. "Silicon Processing For The VLSI Era–vol. 1", Lattice Press. Sunset Beach, CA, 1986, p. 563.
Wolf etal., "Silicon Processing For The VLSI Era–vol. 1", Lattice Press, SUnset CA, 1986, p. 563–564.

*Primary Examiner*—John F. Niebling
*Assistant Examiner*—David A. Zarneke
*Attorney, Agent, or Firm*—George O. Saile; Stephen B. Ackerman

[57] ABSTRACT

A method for etching access opening to aluminum alloy wire bonding pads of integrated circuit chips is described wherein a polymer layer is in-situ deposited into the opening after the bonding pad has been exposed by dry etching of a passivation layer. The passivation layer, is first etched with fluorocarbon etchants and then a TiN ARC layer is removed from over the aluminum bonding pad with etchants which may contain chlorine either as etch components or as a contaminant in an etchant such as $SF_6$ non-volatile chlorine containing residues including $AlCl_3$ and trapped $Cl_2$, are left behind after the ARC layer has been removed. These cause corrosion of the bonding pad when exposed to atmospheric moisture. The polymer layer deposited immediately after the pad surface is exposed by the etchant, provides a temporary seal over the aluminum bonding pad, protecting it from exposure to moisture during subsequent processing steps.

20 Claims, 3 Drawing Sheets

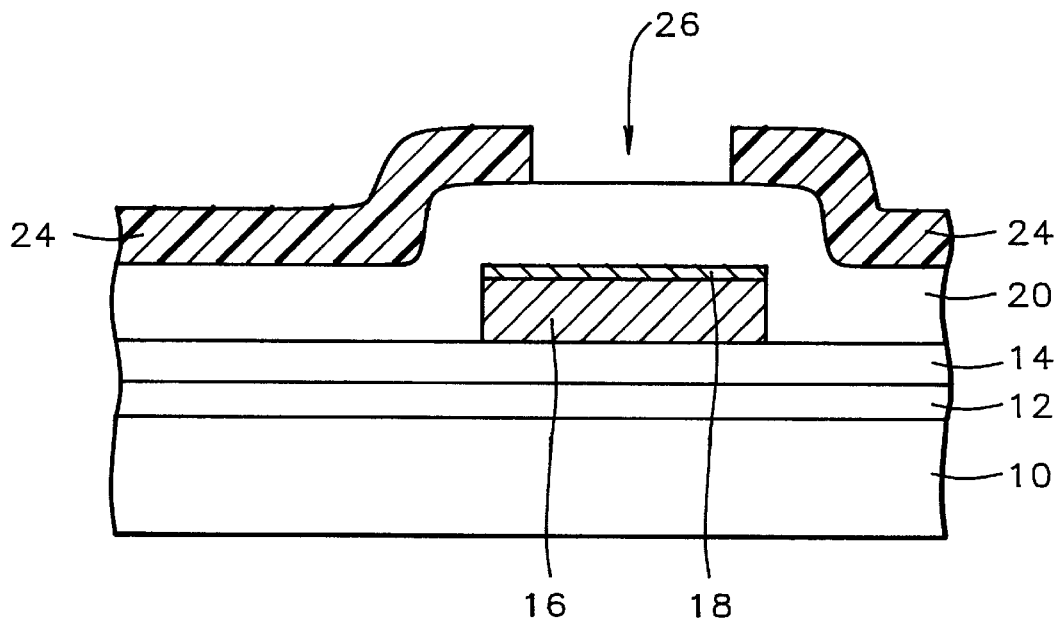
FIG. 1 – Prior Art
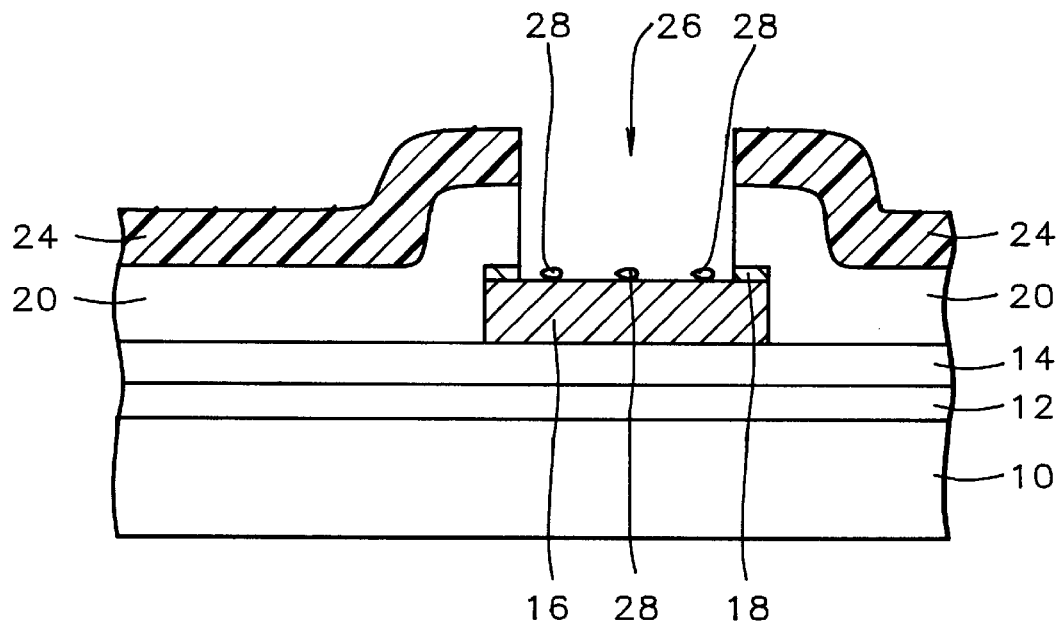
FIG. 2 – Prior Art

PROCESS FOR PREVENTING CORROSION OF ALUMINUM BONDING PADS AFTER PASSIVATION/ARC LAYER ETCHING

BACKGROUND OF THE INVENTION (1) Field of the Invention

The invention relates to processes for the manufacture of semiconductor devices and more particularly to the etching of passivation layers to expose aluminum bonding pads.

(2) Description of Prior Art

Integrated circuits (ICs) are manufactured by first forming discrete semiconductor devices within the surface of silicon wafers. A multi-level metallurgical interconnection network is then formed over the devices contacting their active elements and wiring them together to create the desired circuits. The wiring layers are formed by first depositing an insulating layer over the discrete devices, patterning and etching contact openings into this layer, and then depositing conductive material into these openings. A conductive layer is then applied over the insulating layer which is then patterned and etched to form wiring interconnections between the device contacts thereby creating a first level of basic circuitry. These circuits are then further interconnected by utilizing additional wiring levels laid out over a additional insulating layers with via pass throughs.

Depending upon the complexity of the overall integrated circuit, one or two levels of patterned polysilicon conductors and two or more levels of metallurgy are required to form the necessary interconnections and to direct the wiring to pads to which the chip's external wiring connections are bonded.

The metal wiring layers, typically of an aluminum alloy containing copper and silicon, are deposited by sputtering or vacuum evaporation. An anti-reflective coating (ARC) is deposited over the metal layer in order to reduce light reflection from the metal surface during the subsequent photolithographic exposure of the patterning photoresist. These reflections degrade the image sharpness. Typically the ARC layer consists of about 300 Angstroms of sputter deposited TiN.

After the metal is patterned using reactive-ion-etching (RIE) an insulative layer, typically a borophosphosilicate glass, is deposited and via openings are etch through this layer to provide accesses of the next metal wiring layer to the one below. The TiN also serves as an etch stop during via etching of this insulative layer. The final metallization layer includes the bonding pads which are typically located in the periphery of the integrated circuit. Again, an ARC layer is provided. After the final metallization layer is patterned a passivation layer is applied. This layer seals the device structures on the wafer from contaminants and moisture, and also serves as a scratch protection layer. The passivation layer typically consists of a layer of silicon nitride or phosphosilicate glass (PSG) over a layer of silicon oxide. Both of these layers are deposited by plasma enhanced chemical vapor deposition (PECVD). The passivation layer is then coated with photoresist and openings to the bonding pads are formed by plasma etching.

Referring to FIG. 1, there is shown a cross section of a wafer 10 having semiconductor devices and a multilevel wiring structure represented by the layer 12. An aluminum alloy bonding pad 16 resides atop the uppermost inter metal dielectric (ILD) layer 14. The pad 16 was patterned by a previous photolithographic step wherein the ARC layer 18 was used beneath a photoresist layer. The passivation layer 20, typically silicon nitride or a phosphosilicate glass (PSG), sometimes with a subjacent silicon oxide layer forms a protective coating over the integrated circuit. A layer of photoresist 24 is applied and patterned to provide an access opening 26 to the bonding pad 16 so that the pad may be wire bonded to the external chip package.

In a conventional process the passivation layer is etched by plasma etching using well known fluorocarbon etchants such as $CHF_3$ and $CF_4$ and a carrier gas such as He. Endpoint is determined by well known methods such as optical emission spectroscopy wherein the components of the etching plasma are observed over time. When endpoint is observed an over etch period is applied in order to assure complete exposure of the bonding pad. In specific instances, other openings such as access openings to polysilicon fuses, must also be during this etch step. This requires a considerable over-etch of the bonding pad opening because additional layers of dielectric must be penetrated to access the polysilicon fuses. The TiN ARC layer 18 has a high resistance to the fluorocarbon etchants and thus permits a considerable amount of over-etch without penetration of the aluminum bonding pad 16.

After the oxide over-etch period, the gas mixture is changed to etch away the TiN ARC layer 18 in the opening 26, thereby exposing the aluminum bonding pad 16. A preferred etchant for this purpose is sulphur hexafluoride ($SF_6$) in combination with a fluorocarbon.

A problem with commercially available $SF_6$, even in high purity dispensings, is that it often contains trace quantities of chlorine. Residual gas analysis has revealed chlorine content of the order of 10 nanograms per gram of $SF_6$. In some instances levels as high as 2600 nanograms per gram were found.

Referring to FIG. 2 there is shown a cross section of the region of FIG. 1 after the passivation layer 20 and the ARC layer 18 have been etched. These trace amounts of chlorine when combined with moisture have a corrosive effect upon the aluminum surface. Chlorine reacts with the aluminum to form non-volatile $AlCl_3$ residues 28 which remain on the surface of the exposed bonding pad 16 after the RIE. These residues 28 are extremely hygroscopic and, if allowed to remain exposed on the wafer, react with the slightest moisture to produce acids which cause severe corrosion of the aluminum bonding pad. Free chlorine, entrapped within such residues, is also hydrolyzed by moisture and becomes corrosive to aluminum. A brief discussion of this metal corrosion problem is given by Wolf, S. and Tauber, R. N., "Silicon Processing for the VLSI Era", Vol. 1, Lattice Press, Sunset Beach, Calif., (1986), p563.

In the conventional method the wafer is removed from the RIE tool after the TiN etch, thereby bringing the freshly exposed aluminum surfaces in contact with atmospheric moisture. If chlorine containing residues are present, aluminum corrosion effects become evident within minutes of exposure.

Man, et.al., U.S. Pat. No. 5,533,635 cites a process for stabilizing chlorine containing residues after aluminum metal patterning with chlorine containing etchants by baking the wafer in an atmosphere containing $O_2$ and $CF_4$ for between about 5 and 60 seconds. During this baking period residual chlorine is converted to a stable polymer. The polymer and residual photoresist are subsequently removed by ashing and rinsing in DI water.

Mihara et.al. U.S. Pat. No. 5,447,598 shows a method for forming a polymer layer on the sidewalls of a multi-level resist layer but does not address the problem of stabilizing chlorine species with a polymer over an aluminum surface.

Kadomura, U.S. Pat. No. 5,540,812 shows a method for etching aluminum which prevents corrosion by using $S_2F_2$ to etch through a subjacent TiW barrier layer. The $S_2F_2$ produces a sulfur based sidewall protection film over TiW while causing a fluorine-for-chlorine exchange in a carbonaceous polymer sidewall film which had previously been formed during the aluminum etching with a chlorine based etchant. The sulfur and carbonaceous films are subsequently removed by ashing.

SUMMARY OF THE INVENTION

Accordingly, it is an object of this invention to provide a method for protecting aluminum alloy bonding pads from corrosion caused by chlorine containing residues.

It is another object of this invention to provide a method for forming a seal over an aluminum bonding pad thereby protecting it from atmospheric exposure.

It is yet another object of this invention to provide a method for etching an access opening to an aluminum bonding pad and preparing the bonding pad for subsequent wire bonding.

These and other objects are accomplished by first etching bonding pad openings in a passivation layer and ARC layer and then, in the same tool and without breaking vacuum, depositing thin polymer coating over the exposed bonding pad. The polymer coating is deposited by admitting fluorocarbon gases into the plasma etching tool in proportions and under conditions disclosed by this invention. The polymer layer provides a temporary seal over the bonding pad which prevents moisture corrosion of the bonding pad during the subsequent processing. The polymer layer is eventually removed by conventional photoresist stripping methods during a later processing step.

BRIEF DESCRIPTION OF THE DRAWINGS

FIG. 1 is a cross section of an integrated circuit wafer showing a bonding pad covered by a passivation layer and a photoresist mask patterned to etch an access opening to the bonding pad.

FIG. 2 is a cross section of a bonding pad which has been exposed by etching wherein trace amounts of chlorine in the reactant gas have left corrosive residues on the bonding pad surface.

DESCRIPTION OF THE PREFERRED EMBODIMENTS

Figure 3:
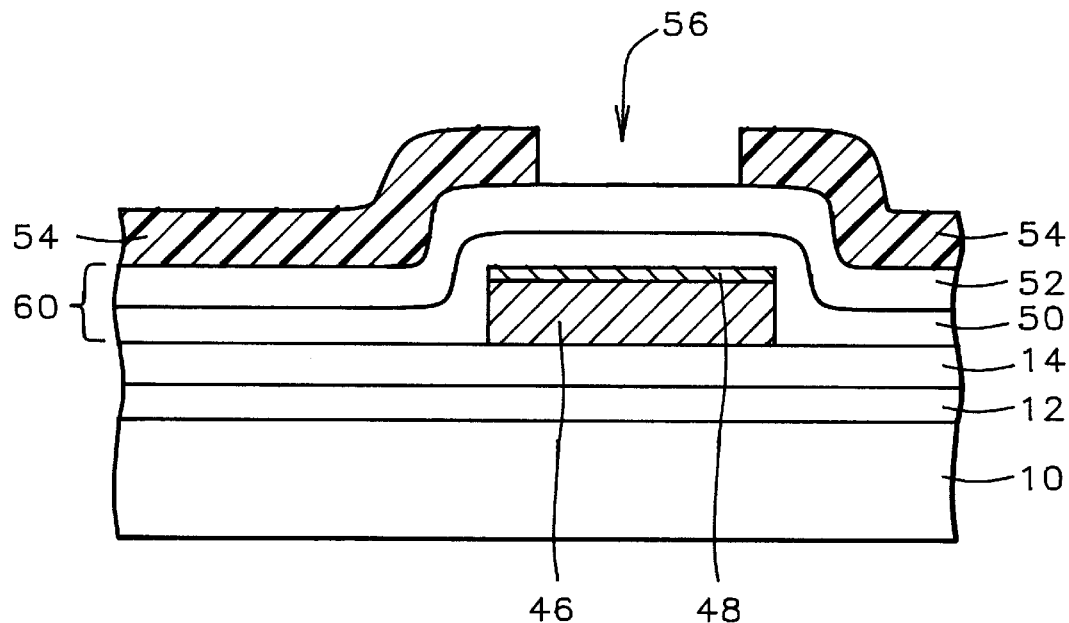
FIG. 3 is a cross section of a bonding pad which has been covered with a passivation layer to illustrate a preferred embodiment of this invention.

In a first embodiment of this invention an access opening to an aluminum alloy bonding pad is formed through a passivation layer and an ARC layer. Referring to FIG. 3, a silicon wafer 10 having integrated circuit devices formed upon its surface is provided. A plurality of wiring patterns are formed over the wafer separated by insulative layers and interconnected through contacts and vias using integrated circuit processes well known by those skilled in the art. These layers and wiring patterns are represented in the figure by the layer 12. The wiring pattern of are terminated at aluminum alloy bonding pads formed over a final layer of an insulative material 14 typically in the periphery of the integrated circuit chip. One such bonding pad 46 is shown in cross section in FIG. 3. The bonding pad 46 is typically 100 microns by 100 microns in size and is patterned in an aluminum alloy layer which has an ARC layer 48 deposited over it. The ARC layer 48 is preferably formed of TiN although other materials may also be used. The ARC layer 48 is deposited over the metal layer by sputtering but may also be deposited by other methods such as CVD. ARC 48 layer is typically between about 250 and 400 Angstroms thick.

After the metal bonding pad 46 with its superjacent ARC layer 48 has been patterned, a passivation layer 60 is deposited over the wafer. The layer 50 for this embodiment comprises a silicon oxide layer 50 deposited over the bonding pads 46 and a silicon nitride layer 52 deposited over the silicon oxide layer 50. The layers are deposited by PECVD. A layer of photoresist 54 is deposited and patterned by well known photolithographic techniques to define an access opening 56 to the bonding pad 46.

The wafer is next placed into the chamber of a plasma etching tool and evacuated. A typical tool used for this processing is the Model 590 Etcher manufactured by LAM Research Corporation of Fremont Calif.

Figure 4:
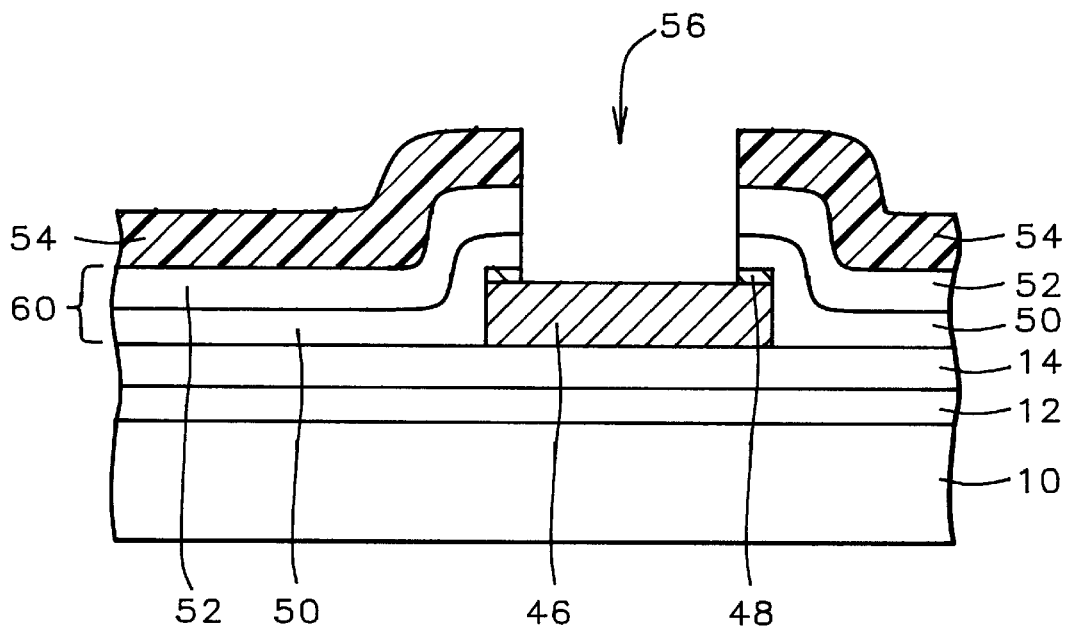
FIG. 4 is a cross section of a bonding pad after a passivation layer and an ARC layer have been etched to illustrate a preferred embodiment of this invention.

Referring now to FIG. 4, the etching of the access opening 56 is begun by first etching the patterned opening through the silicon nitride layer 52 and the silicon oxide layer 50 at a pressure of 2.5 Torr or thereabout, using a power density of 4.6 Watts/cm$^2$ or thereabout and an anode-to-cathode spacing of 0.39 cm. or thereabout. The etching gas mixture comprises $CHF_3$ at 18 SCCM or thereabout, $CF_4$ at 72 SCCM or thereabout, and He at 165 SCCM or thereabout. The etching tool is calibrated so that endpoint is determined according to a specific time interval. After the silicon oxide layer 50 has been etched an 80% over etch period is provided. The ARC layer 48 is sufficiently resistant to withstand the over etch so that a portion of it remains after the oxide etch.

The reactant mixture is then altered to etch the TiN ARC layer 48. For this, the anode-to-cathode spacing in the LAM Model 590 etcher is increased to about 0.8 cm., the pressure is reduced to 1 Torr or thereabout, and a gas mixture comprising $CF_4$ at 40 SCCM or thereabout, $SF_6$ at 20 SCCM or thereabout, and He at 180 SCCM or thereabout is flowed through the etching chamber to etch the TiN. The rf power is maintained at 4.6 Watts/cm$^2$ or thereabout.

Figure 5:
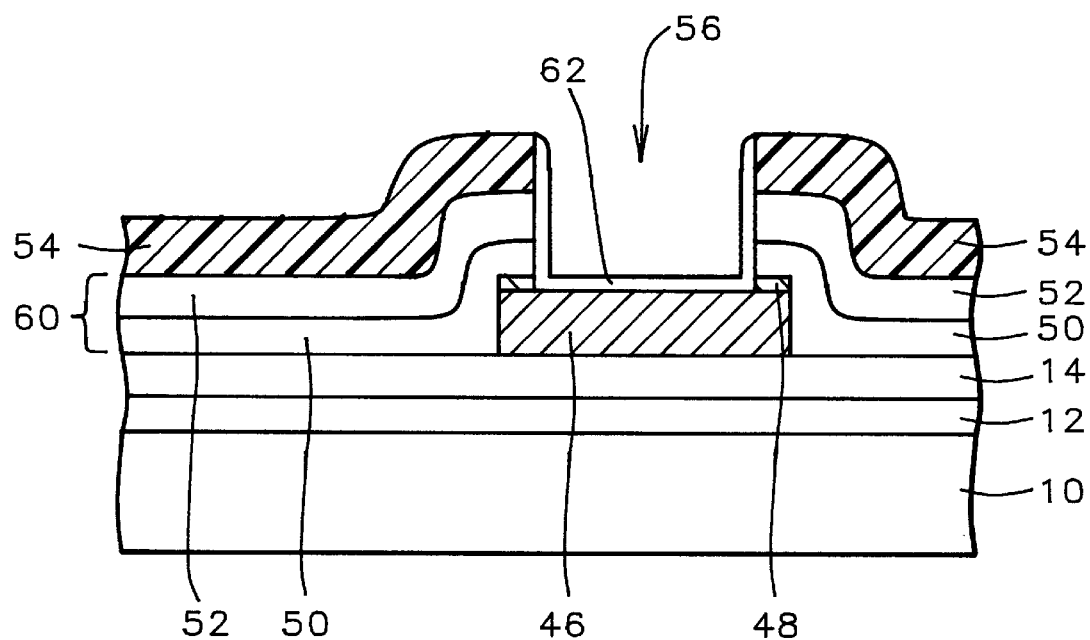
FIG. 5 is a cross section of a bonding pad after a polymer layer has been deposited according to a preferred embodiment of this invention.

After the TiN has been etched, and without breaking vacuum, the gas mixture and etching parameters are again altered to form a protective polymer layer over the just exposed aluminum surface of the bonding pad. The pressure is returned to 2.5 Torr and the spacing to 0.39 cm. A gas mixture of $CHF_3$ at 72 SCCM or thereabout, $CF_4$ at 18 SCCM or thereabout, and He at 165 SCCM or thereabout is admitted and the rf power is reduced to about 3.7 Watts/cm$^2$. A polymer layer forms at a rate of about 20 Angstroms/min. under these conditions. Referring now to FIG. 5, the polymer layer 62 coats the aluminum surface and the walls of the access opening 56, thereby sealing the bonding pad 46 to atmospheric exposure. The desired thickness of polymer deposited is between about 200 and 300 Angstroms, This amount of polymer forms in about 10 to 15 seconds under the cited conditions.

The wafer is then removed from the etching tool with the bonding pad surfaces protected against exposure to moisture by the polymer layer.

While the invention has been particularly shown and described with reference to the preferred embodiments thereof, it will be understood by those skilled in the art that various changes in form and details may be made without departing from the spirit and scope of the invention.

What is claimed is:

1. A method for forming an access opening to and providing a protective coating on a bonding pad comprising:
   (a) providing a silicon wafer having a bonding pad upon which a passivation layer has been deposited;
   (b) depositing a photoresist layer over said silicon wafer;
   (c) patterning said photoresist layer to define an access opening;
   (d) placing said silicon wafer into a plasma etching tool;
   (e) etching said passivation layer with $SF_6$ whereby exposing said bonding pad;
   (f) depositing a polymer layer over said bonding pad, wherein said polymer layer is deposited after said passivation layer has been etched without breaking vacuum; and
   (g) removing said silicon wafer from said plasma etching tool.

2. The method of claim 1 wherein said bonding pad is selected from the group consisting of aluminum, and an aluminum alloy.

3. The method of claim 1 wherein said plasma etcher is an RIE tool and said etching is performed by RIE.

4. The method of claim 1 wherein said passivation layer is selected from the group consisting of silicon nitride, a phosphosilicate glass, a layer of silicon nitride over a layer of silicon oxide, and a layer of phosphosilicate glass over a layer of silicon oxide.

5. The method of claim 1 wherein said passivation layer is etched at a pressure of between about 2.25 and 2.75 Torr in a plasma containing $CHF_3$ at a flow rate of about 18 SCCM, $CF_4$ at a flow rate of about 72 SCCM, and He at a flow rate of about 165 SCCM.

6. The method of claim 1 wherein said polymer layer is deposited at a pressure of between about 2.25 and 2.75 Torr in a plasma containing $CHF_3$ at a flow rate of about 72 SCCM, $CF_4$ at a flow rate of about 18 SCCM, and He at a flow rate of about 165 SCCM.

7. The method of claim 1 wherein said polymer layer is deposited for a period of at least 10 seconds.

8. The method of claim 1 wherein said polymer layer is between about 200 and 300 Angstroms thick.

9. The method of claim 1 wherein a said passivation layer is over etched by at least 10 percent.

10. A method for forming an access opening to a bonding pad having an ARC comprising:
    (a) providing a silicon wafer having a bonding pad with an anti reflective coating (ARC) over its surface upon which a passivation layer has been deposited;
    (b) depositing a photoresist layer over said silicon wafer;
    (c) patterning said photoresist layer to define said access opening;
    (d) placing said silicon wafer into a plasma etching tool;
    (e) etching said passivation layer thereby exposing said ARC;
    (f) etching said ARC with $SF_6$;
    (g) depositing a polymer layer over said bonding pad, wherein said polymer layer is deposited after said ARC has been etched and without breaking vacuum; and
    (h) removing said silicon wafer from said plasma etching tool.

11. The method of claim 10 wherein said bonding pad is selected from the group consisting of aluminum, and an aluminum alloy.

12. The method of claim 10 wherein said ARC layer comprises TiN.

13. The method of claim 10 wherein said plasma etcher is an RIE tool and said etching is performed by RIE.

14. The method of claim 10 wherein said passivation layer is selected from the group consisting of silicon nitride, a phosphosilicate glass, silicon nitride over silicon oxide, and phosphosilicate glass over silicon oxide.

15. The method of claim 10 wherein said passivation layer is etched at a pressure of between about 2.25 and 2.75 Torr in a plasma containing $CHF_3$ at a flow rate of about 18 SCCM, $CF_4$ at a flow rate of about 72 SCCM, and He at a flow rate of about 165 SCCM.

16. The method of claim 10 wherein said ARC layer is etched at a pressure of between about 0.75 and 1.25 Torr in a plasma containing $SF_6$ at a flow rate of about 20 SCCM, $CF_4$ at a flow rate of about 40 SCCM, and He at a flow rate of about 180 SCCM.

17. The method of claim 10 wherein said polymer layer is deposited at a pressure of between about 2.25 and 2.75 Torr in a plasma containing $CHF_3$ at a flow rate of about 72 SCCM, $CF_4$ at a flow rate of about 18 SCCM, and He at a flow rate of about 165 SCCM.

18. The method of claim 10 wherein said polymer layer is deposited for a period of at least 10 seconds.

19. The method of claim 10 wherein said polymer layer is between about 200 and 300 Angstroms thick.

20. The method of claim 10 wherein a said passivation layer is over etched by at least 10 percent.

* * * * *

UNITED STATES PATENT AND TRADEMARK OFFICE
CERTIFICATE OF CORRECTION

PATENT NO.  : 5,930,664
DATED       : July 27, 1999
INVENTOR(S) : Fang-Jen Hsu, Chen-Peng Fan, Ming-Shuo Yen,
              Chi-Ping Chen It is certified that error appears in the above-identified patent and that said Letters Patent is hereby corrected as shown below:

On the title page, item [75], delete;

Fang-Jen Hsu, Hsin-Chu; Chen-Peng Fan; Ming-Shuo Yen, both of Taitung; Chi-Ping Chen, Hsin-chu, all of Taiwan and replace with:

Fang-Jen Hsu; Chen-Peng Fan, both of Hsin-chu; Ming-Shuo Yen, Taitung; Chi-Ping Chen, Hsin-chu, all of Taiwan Signed and Sealed this Twelfth Day of December, 2000

Attest:

Q. TODD DICKINSON

*Attesting Officer*      *Director of Patents and Trademarks*